United States Patent
Yamamoto et al.

(10) Patent No.: US 8,025,990 B2
(45) Date of Patent: Sep. 27, 2011

(54) HARD COATING FILM AND TARGET FOR FORMATION THEREOF

(75) Inventors: Kenji Yamamoto, Kobe (JP); German Fox-Rabinovich, Hamilton (CA)

(73) Assignee: Kobe Steel, Ltd., Kobe-shi (JP)

( * ) Notice: Subject to any disclaimer, the term of this patent is extended or adjusted under 35 U.S.C. 154(b) by 144 days.

(21) Appl. No.: 12/396,012

(22) Filed: Mar. 2, 2009

(65) Prior Publication Data

US 2009/0269614 A1    Oct. 29, 2009

(30) Foreign Application Priority Data

Apr. 24, 2008  (JP) ................................. 2008-114339

(51) Int. Cl.
  *B32B 9/00*   (2006.01)
(52) U.S. Cl. ....... 428/697; 51/307; 51/309; 204/298.13; 428/698; 428/699; 428/704
(58) Field of Classification Search .................. 428/697, 428/698, 699, 704; 204/298.13; 51/307, 51/309
  See application file for complete search history.

(56) References Cited

U.S. PATENT DOCUMENTS

| | | | |
|---|---|---|---|
| 6,824,601 B2 * | 11/2004 | Yamamoto et al. ............ | 428/698 |
| 7,060,345 B2 * | 6/2006 | Fukui et al. .................... | 428/699 |
| 7,217,466 B2 * | 5/2007 | Weber et al. ................... | 428/697 |
| 2002/0168552 A1 | 11/2002 | Yamamoto et al. | |
| 2004/0018393 A1 | 1/2004 | Fukui et al. | |
| 2008/0318062 A1* | 12/2008 | Endrino et al. ............... | 428/446 |

FOREIGN PATENT DOCUMENTS

| | | | |
|---|---|---|---|
| DE | 19818782 | * | 10/1999 |
| EP | 1 873 273 A1 | | 1/2008 |
| JP | 2644710 | | 5/1997 |
| JP | 2000-297365 | | 10/2000 |
| JP | 2002-18606 | | 1/2002 |
| JP | 2002-331407 | | 11/2002 |
| JP | 2003-71610 | | 3/2003 |
| JP | 2003-71611 | | 3/2003 |
| JP | 2004-42192 | | 2/2004 |
| JP | 2004-338058 | | 12/2004 |
| WO | WO 2006/005217 A2 | | 1/2006 |

OTHER PUBLICATIONS

Lewis et al "The influence of the yttrium content on the structure and properties of Ti(1-x-y-z)AlxCryYzN PVD hard coatings" Surface & Coatings Techn 114 (1999) p. 187-199.*

(Continued)

*Primary Examiner* — A. A. Turner
(74) *Attorney, Agent, or Firm* — Oblon, Spivak, McClelland, Maier & Neustadt, L.L.P.

(57) ABSTRACT

A hard coating film having oxidation resistance and wear resistance superior to those of conventional coating films formed of TiAlN, TiCrAlN, TiCrAlSiBN, CrAlSiBN, NbCrAlSiBN, or the like. The hard coating film of the present invention has a component composition represented by the formula:

$$(Ti_a Cr_b Al_c M_d B_e)(C_x N_{1-x}),$$

wherein $0 \leq a \leq 0.2$, $0.05 \leq b \leq 0.4$, $0.45 \leq c \leq 0.65$, $0.005 \leq d \leq 0.05$, $0 \leq e \leq 0.15$, $a+b+c+d+e=1$, and $0 \leq x \leq 0.5$; where M denotes at least one species selected from the group consisting of Ce, Pr, and Sc; variables a, b, c, d, and e indicate the atomic ratios of Ti, Cr, Al, M, and B respectively; and variable x indicates the atomic ratio of C.

21 Claims, 1 Drawing Sheet

OTHER PUBLICATIONS

Yamamoto et al "Structural and mechanical property of Si incorporated (Ti,Cr,Ai)N coatings deposited by arch ion plating process" Surface & Coatings Techn 200 (2005) p. 1383-1390.*

U.S. Appl. No. 12/882,565, filed Sep. 15, 2010, Yamamoto.

G. S. Fox-Rabinovich, et al., "Nanocrystalline coating design for extreme applications based on the concept of complex adaptive behavior", Journal of Applied Physics, vol. 103, No. 8, XP012110525, Apr. 18, 2008, pp. 083510-1-083510-10.

* cited by examiner

FIG. 1

HARD COATING FILM AND TARGET FOR FORMATION THEREOF

BACKGROUND OF THE INVENTION

1. Field of the Invention

The present invention relates to a hard coating film and a target used for forming the same. More particularly, the invention relates to a hard coating film formed on a substrate for enhancing the wear resistance thereof, and also relates to a target for forming the hard coating film, in the fabrication of cutting tools to be used for such purposes as metal cutting, drilling and end milling, metal dies to be used for such purposes as forging, press molding and extrusion molding, and jigs and tools to be used for such purposes as punching and blanking.

2. Description of the Related Art

Conventionally, on a cutting tool made of a substrate such as cemented carbide, cermet or high-speed tool steel, for example, a hard coating film formed of such a substance as TiN (nitride of Ti), TiCN (carbonitride of Ti), or TiAlN (complex nitride of Ti and Al) has been provided for enhancing the wear resistance thereof. In particular, as disclosed in Patent Document 1 indicated below, a hard coating film formed of TiAlN, which has higher wear resistance than TiN and TiCN, is suitable for cutting tools to be used for high-speed cutting operation or for cutting tools to be used for cutting high-hardness work materials such as quench-hardened steels. Further, as a hard coating film having enhanced wear resistance, there is disclosed a coating film formed of TiAlN containing Cr as an additive component, which provides a characteristic of improved oxidation resistance by increasing the content of Al while keeping a cubic crystal structure for ensuring high hardness (as disclosed in Patent Document 2). Still further, a hard coating film formed of TiCrAlN containing Si and B as additive components has been proposed for higher oxidation resistance (as disclosed in Patent Document 3), and a hard coating film formed of CrAlN containing Si, B, and at least one species selected from Nb, Mo, W, and Ta as additive components has been proposed for improvement in oxidation resistance (as disclosed in Patent Document 4). Furthermore, Patent Document 5 discloses a hard coating film having excellent wear resistance, which is formed of a nitride of a composition represented by the formula $Al_xTi_{1-x-y-z}M_yR_z$, (where M denotes at least one species selected from Si, Cr, W, and Mo; and R indicates at least one species selected from Y, Ce, La, and other rare earth metals including misch metals; and the following atomic ratio conditions are specified: $0.05 \leq x \leq 07$, $0.02 \leq y \leq 0.25$, and $0.0005 \leq z \leq 0.05$). Moreover, for the purpose of ensuring wear resistance and other desirable characteristics, a hard coating film (TiSi)(NB) formed of TiN containing Si as an additive component, and a hard coating film (CrSi)(NB) formed of CrN containing Si as an additive component have been proposed (as disclosed in Patent Documents 6 and 7). Still further, a hard coating film (TiCr)(CNO) has been proposed (as disclosed in Patent Document 8).

Nevertheless, it has still been desired to provide an improved hard coating film having higher oxidation resistance and higher wear resistance in order to meet an increase in hardness of work materials and an increase in cutting speed required therefor in recent years.

PATENT DOCUMENT 1

Japanese Patent No. 2644710

PATENT DOCUMENT 2

Japanese Unexamined Patent Publication No. 2003-71610

PATENT DOCUMENT 3

Japanese Unexamined Patent Publication No. 2003-71611

PATENT DOCUMENT 4

International Publication WO No. 2006/005217

PATENT DOCUMENT 5

Japanese Unexamined Patent Publication No. 2000-297365

PATENT DOCUMENT 6

Japanese Unexamined Patent Publication No. 2002-331407

PATENT DOCUMENT 7

Japanese Unexamined Patent Publication No. 2002-18606

PATENT DOCUMENT 8

Japanese Unexamined Patent Publication No. 2004-42192

OBJECT AND SUMMARY OF THE INVENTION

In view of the above, it is a general object of the present invention to provide a hard coating film having oxidation resistance and wear resistance superior to those of conventional coating films formed of TiAlN, TiCrAlN, TiCrAlSiBN, CrAlSiBN, NbCrAlSiBN, or the like, and also a target used for forming the hard coating film.

In accomplishing this object of the present invention and according to one aspect thereof, there is provided a first hard coating film formed on the surface of a substrate, the first hard coating film comprising a component composition represented by the formula:

$$(Ti_aCr_bAl_cM_dB_e)(C_xN_{1-x})$$

wherein $0 \leq a \leq 0.2$
  $0.05 \leq b \leq 0.4$
  $0.45 \leq c \leq 0.65$
  $0.005 \leq d \leq 0.05$
  $0 \leq e \leq 0.15$
  $a+b+c+d+e=1$
  $0 \leq x \leq 0.5$ where M denotes at least one species selected from the group consisting of Ce, Pr, and Sc; variables a, b, c, d, and e indicate the atomic ratios of Ti, Cr, Al, M, and B respectively; and variable x indicates the atomic ratio of C.

According to another aspect of the present invention, there is provided a second hard coating film formed on the surface of a substrate, the second hard coating film comprising a component composition represented by the formula:

$$(Ti_aCr_bAl_cM_dR_fB_e)(C_xN_{1-x})$$

wherein $0 \leq a \leq 0.2$
  $0.05 \leq b \leq 0.4$
  $0.45 \leq c \leq 0.65$
  $0.005 \leq d \leq 0.05$ 0.01≦f≦0.1
0≦e≦0.15
a+b+c+d+e+f=1
0≦x≦0.5 where M denotes at least one species selected from the group consisting of Ce, Pr, and Sc; R denotes at least one of Si and Y; variables a, b, c, d, f, and e indicate the atomic ratios of Ti, Cr, Al, M, R, and B respectively; and variable x indicates the atomic ratio of C.

Further, according to another aspect of the present invention, there is provided a third hard coating film formed on the surface of a substrate, the third hard coating film comprising a component composition represented by the formula:

$$(Ti_aCr_bM'_dSi_fB_e)(C_xN_{1-x})$$

wherein 0.55≦a+b≦0.945
0.005≦d≦0.05
0.05≦f≦0.4
0≦e≦0.15
a+b+d+e+f=1
0≦x≦0.5 where M' denotes at least one species selected from the group consisting of Ce, Pr, Sc, and Y; variables a, b, d, f, and e indicate the atomic ratios of Ti, Cr, M', Si, and B respectively, either one of the variables a and b being allowable to equal zero; and variable x indicates the atomic ratio of C.

In a case where M' in the formula shown above denotes Y in the formation of the third hard coating film, it is preferable that the variable b should be no less than 0.05.

Still further, according to another aspect of the present invention, there is provided a machine shop tool comprising a substrate and at least one of the above-mentioned first to third hard coating films formed on the surface thereof.

Furthermore, according to another aspect of the present invention, there is provided a target used for forming each of the above-mentioned first to third hard coating films on the surface of a substrate by means of arc ion plating. More specifically, there is provided a target used for forming the above-mentioned first hard coating film by arc ion plating, the target comprising a component composition represented by the formula:

$$Ti_aCr_bAl_cM_dB_e$$

wherein 0≦a≦0.2
0.05≦b≦0.4
0.45≦c≦0.65
0.005≦d≦0.05
0≦e≦0.15
a+b+c+d+e=1 where M denotes at least one species selected from the group consisting of Ce, Pr, and Sc; and variables a, b, c, d, and e indicate the atomic ratios of Ti, Cr, Al, M, and B respectively.

Further, there is provided a target used for forming the above-mentioned second hard coating film by arc ion plating, the target comprising a component composition represented by the formula:

$$Ti_aCr_bAl_cM_dR_fB_e$$

wherein 0≦a≦0.2
0.05≦b≦0.4
0.45≦c≦0.65
0.005≦d≦0.05
0.01≦f≦0.1
0≦e≦0.15
a+b+c+d+e+f=1 where M denotes at least one species selected from the group consisting of Ce, Pr, and Sc; R denotes at least one of Si and Y; and variables a, b, c, d, f, and e indicate the atomic ratios of Ti, Cr, Al, M, R, and B respectively.

Still further, there is provided a target used for forming the above-mentioned third hard coating film by arc ion plating, the target comprising a component composition represented by the formula:

$$Ti_aCr_bM'_dSi_fB_e$$

wherein 0.55≦a+b≦0.945
0.005≦d≦0.05
0.05≦f≦0.4
0≦e≦0.15
a+b+d+e+f=1 where M' denotes at least one species selected from the group consisting of Ce, Pr, Sc, and Y; and variables a, b, d, f, and e indicate the atomic ratios of Ti, Cr, M', Si, and B respectively, either one of the variables a and b being allowable to equal zero.

It is preferable that each of the above-mentioned targets used for hard coating film formation should have an oxygen content of no higher than 0.3% by mass.

As set forth hereinabove and according to the present invention, it is possible to provide a hard coating film having oxidation resistance and wear resistance superior to those of conventional coating films formed of TiAlN, TiCrAlN, TiCrAlSiBN, CrAlSiBN, NbCrAlSiBN, or the like. The hard coating film featuring superior oxidation resistance and wear resistance in accordance with the present invention is highly useful as a film to be formed on the surface of a substrate in the fabrication of various cutting tools to be used for metal working, metal dies to be used for forging, press molding and extrusion molding, and jigs and tools to be used for punching and blanking, for example.

The above and other objects, features and advantages of the present invention will become more apparent from the following detailed description.

DESCRIPTION OF THE PREFERRED EMBODIMENTS

The present inventors have conducted intensive examinations from various points of view to attain a hard coating film having oxidation resistance and wear resistance superior to those of conventional coating films. As a result of these examinations, it was found that significant enhancement in both oxidation resistance and wear resistance of a hard coating film can be achieved by providing proper compositional proportions of the contents of rare earth metals such as Ce, Pr, Sc and Y, and the contents of elements such as Ti, Al, Cr and Si in the formation thereof. As regards the hard coating film of the present invention accomplished to provide excellent oxidation resistance and wear resistance, the following describes the reasons for selection of the above elements and for limitations in compositional ranges thereof.

In a preferred embodiment of the present invention, a first hard coating film is defined as comprising a component composition represented by the formula:

$$(Ti_aCr_bAl_cM_dB_e)(C_xN_{1-x})$$

wherein $0 \leq a \leq 0.2$
$0.05 \leq b \leq 0.4$
$0.45 \leq c \leq 0.65$
$0.005 \leq d \leq 0.05$
$0 \leq e \leq 0.15$
$a+b+c+d+e=1$
$0 \leq x \leq 0.5$ where M denotes at least one species selected from the group consisting of Ce, Pr, and Sc; variables a, b, c, d, and e indicate the atomic ratios of Ti, Cr, Al, M, and B respectively; and variable x indicates the atomic ratio of C. (The same shall apply hereinafter with respect to the first hard coating film.)

Through examinations conducted by the present inventors for improvement in oxidation resistance and wear resistance on the basis of a hard coating film having a component composition of TiAlMBCN containing at least one species of rare earth metals (M: rare earth metal) as disclosed in Patent Document 5, it was found that the oxidation resistance of a hard coating film can be enhanced significantly by using Cr as an essential component element and at least one additive species selected from the rare-earth group consisting of Ce, Pr and Sc in particular, and that both the oxidation resistance and hardness thereof can be improved considerably by limiting the content of Ti (a) to no higher than 0.2 (in terms of atomic ratio).

Ti contained in a hard coating film is an element that forms an oxide thereof having relatively poor protectiveness, i.e., TiO$_2$ (rutile), when the temperature of the hard coating film becomes high. Hence, in the present preferred embodiment, the upper limit of Ti content (a) should be 0.2, preferably no higher than 0.15. Because of the reason mentioned above, the content of Ti may be zero. However, since a decrease in hardness is likely to occur if the content of Ti is zero, it is preferable that the lower limit of Ti should be at least 0.05. In cases where a higher degree of hardness is required, the content of Ti should be more preferably at least 0.1.

Since Cr is an essential component element that is effective for enhancement in oxidation resistance as mentioned above, the content of Cr (b) should be at least 0.05 in the present preferred embodiment. To provide adequate oxidation resistance, it is preferable that the content of Cr should be higher than 0.25. In cases where a higher degree of heat resistance is required for such an application as high-speed dry cutting, the content of Cr should be more preferably at least 0.3 for further enhancement in oxidation resistance. Thus, adequate oxidation resistance can be ensured even in such a situation that the surface temperature of a cutting tool becomes considerably high at the time of high-speed dry cutting. It is to be noted, however, that a nitride of Cr (CrN) has relatively low hardness as compared with that of TiN. If the content of Cr exceeds 0.4, a decrease in hardness is likely to occur. Hence, the upper limit of Cr content should be 0.4.

Since Al is a component element that is also effective for enhancement in oxidation resistance, the content of Al (c) should be at least 0.45, preferably at least 0.55. It is to be noted, however, that if the content of Al exceeds 0.65, a transition to a hexagonal crystal structure having a relatively soft characteristic is likely to occur in film formation. Hence, the upper limit of Al should be 0.65, preferably no higher than 0.6.

Since Ce, Pr, and Sc are component elements that, in small quantities of addition, are capable of providing oxidation resistance as mention above, the content of at least one species selected from the group consisting of Ce, Pr, and Sc (d) (hereinafter referred to simply as M in some cases) should be at least 0.005, preferably at least 0.01 in the present preferred embodiment. The addition of M has advantageous effects that oxidation resistance is improved and that hardness is enhanced owing to the formation of finer crystal grains. It is to be noted, however, that if the content of M exceeds 0.05, these advantageous effects are saturated and also excessive fineness of crystal grains causes an amorphous state in the process of film formation, resulting in a decrease in hardness. Hence, the upper limit of M content should be 0.05, preferably no higher than 0.03. As a component element represented by M, i.e., a species of the group consisting of Ce, Pr, and Sc, it is particularly preferable to select Sc because of higher effectiveness thereof in oxidation resistance enhancement.

Although the detailed mechanisms that the addition of M brings about the advantageous effect of providing improvement in oxidation resistance are not yet fully elucidated, the scheme thereof would be as follows: When the temperature of the surface of a coating film becomes high due to frictional heat at the time of cutting operation, an oxide film of metallic elements constituting the coating film is formed. In this situation, if rare earth elements are contained in the oxide film thus formed, a closer crystal packing is brought about in the oxide film, resulting in suppression of inward diffusion of oxygen and outward diffusion of metallic elements through the oxide film. It can therefore be presumed that the addition of M provides a high degree of oxidation resistance.

As regards B, the addition thereof brings about the formation of a hard boride of metallic elements. If an excessive quantity of B is added, an amorphous state occurs in the formation of a coating film, resulting in the coating film being softened. Hence, the upper limit of B (e) should be 0.15, preferably no higher than 0.1.

Further, the addition of C (carbon) in lieu of N (nitrogen) produces metallic carbide bonding to provide a higher degree of hardness. It is to be noted, however, that if an excessive quantity of C is added, there occurs a decrease in oxidation resistance. Hence, the upper limit of C (x) in (C+N) should be 0.5 (preferably 0.3).

Specifically, $(Ti_{0.2}Cr_{0.2}Al_{0.55}M_{0.05})N$, $(Ti_{0.2}Cr_{0.3}Al_{0.47}M_{0.03})N$, and $(Cr_{0.35}Al_{0.6}M_{0.05})N$ are recommended as preferable component compositions of the first hard coating film.

In another preferred embodiment of the present invention, a second hard coating film is defined as comprising a component composition represented by the formula:

$$(Ti_aCr_bAl_cM_dR_fB_e)(C_xN_{1-x})$$

wherein $0 \leq a \leq 0.2$
$0.05 \leq b \leq 0.4$
$0.45 \leq c \leq 0.65$
$0.005 \leq d \leq 0.05$
$0.01 \leq f \leq 0.1$
$0 \leq e \leq 0.15$
$a+b+c+d+e+f=1$
$0 \leq x \leq 0.5$ where M denotes at least one species selected from the group consisting of Ce, Pr, and Sc; R denotes at least one of Si and Y; variables a, b, c, d, f, and e indicate the atomic ratios of Ti, Cr, Al, M, R, and B respectively; and variable x indicates the atomic ratio of C. (The same shall apply hereinafter with respect to the second hard coating film.)

Oxidation resistance can be further enhanced by further adding at least one of Si and Y in the formation of the first hard coating film mentioned above. In an application to a cutting tool, for example, an oxide film is formed by heat produced at the time of cutting operation. Si and Y oxides are higher in stability and denser in crystal packing than Ai, Cr and Al oxides. In addition, the dispersion of an oxide of M in an oxide of Si or Y brings about the formation of an oxide film having a characteristic of still closer crystal packing. That is, a combination Si+M, Y+M, or Si+Y+M can contribute to further enhancement in oxidation resistance. To fully produce this advantageous effect, the content of at least one of Si and Y (f) should be at least 0.01, preferably at least 0.02. It is to be noted, however, that if the content of at least one of Si and Y exceeds 0.1, a transition to a hexagonal crystal structure is likely to occur in film formation, resulting in a decrease in hardness. Hence, the upper limit of at least one of Si and Y content should be 0.1 (preferably no higher than 0.05).

The reasons for the specified ranges of the contents of Ti, Cr, Al, M, and B, besides the content of at least one of Si and Y mentioned above, in the second hard coating film are the same as those in the first hard coating film. the reason for the specified range of the content of C in the second hard coating film is the same as that in the first hard coating film.

Specifically, $(Ti_{0.2}Cr_{0.2}Al_{0.55}Si_{0.03}M_{0.02})N$ and $(Cr_{0.35}Al_{0.6}Si_{0.03}M_{0.02})N$ are recommended as preferable component compositions of the second hard coating film.

In another preferred embodiment of the present invention, a third hard coating film is defined as comprising a component composition represented by the formula:

$$(Ti_a Cr_b M'_d Si_f B_e)(C_x N_{1-x})$$

wherein $0.55 \leq a+b \leq 0.945$
$0.005 \leq d \leq 0.05$
$0.05 \leq f \leq 0.4$
$0 \leq e \leq 0.15$
$a+b+d+e+f=1$
$0 \leq x \leq 0.5$ where M' denotes at least one species selected from the group consisting of Ce, Pr, Sc, and Y; variables a, b, d, f, and e indicate the atomic ratios of Ti, Cr, M', Si, and B respectively, either one of the variables a and b being allowable to equal zero; and variable x indicates the atomic ratio of C. (The same shall apply hereinafter with respect to the third hard coating film.)

Through examinations conducted by the present inventors for improvement in oxidation resistance and wear resistance on the basis of a hard coating film (TiSi)(NB) formed of TiN containing Si as an additive component (as disclosed in Patent Document 6), a hard coating film (CrSi)(NB) formed of CrN containing Si as an additive component (as disclosed in Patent Documents 7), and a hard coating film (TiCr)(CNO) (as disclosed in Patent Document 8), it was found that excellent oxidation resistance can be attained by adding at least one species selected from the group consisting of Ce, Pr, Sc, and Y to an augend component composition of (TiCrSi)N.

By adding at least one species (M') selected from the group consisting of Ce, Pr, Sc, and Y together with Si in the formation of a coating film, advantageous effects of providing improvement in oxidation resistance and enhancement in hardness owing to finer crystal grains can be brought about as in the case of the second hard coating film. To fully produce these advantageous effects in the third hard coating film, the content of Si (f) should be at least 0.05 (preferably at least 0.1), and the content of M' (d) should be at least 0.005 (preferably at least 0.01). It is to be noted, however, that if an excessive quantity of Si or M' is added, an appreciable decrease in hardness is likely to occur. Hence, the upper limit of Si content should be 0.4 (preferably 0.3), and the upper limit of M' content should be 0.05 (preferably 0.3).

The total content of Ti and Cr in the third hard coating film depends on the contents of Si and M'. The upper limit of the total content of Ti and Cr (a+b) should be 0.945, and the lower limit thereof should be 0.55. Although an arbitrary atomic ratio of Ti to Cr is allowed, it is to be noted that a Ti-rich state increases hardness while decreasing oxidation resistance. Hence, to ensure higher hardness, it is preferable that the content of Ti should be at least 0.3. In a Cr-rich state, oxidation resistance is likely to increase. Hence, to ensure higher oxidation resistance, it is preferable that the content of Cr should be at least 0.4.

The reasons for the specified ranges of the contents of B and B in the third hard coating film are the same as those in the first hard coating film.

Specifically, $(Ti_{0.7}Si_{0.25}M_{0.05})N$ and $(Ti_{0.3}Cr_{0.4}Si_{0.25}M_{0.05})N$ are recommended as preferable component compositions of the third hard coating film.

In the third hard coating film, if only Y is used as an additive species represented by M', the content of Cr should be preferably at least 0.05. To ensure oxidation resistance in this case, it is preferable to add Cr in the formation of the third hard coating film. In cases where only Y is added as a species represented by M', the content of Cr should be preferably at least 0.05 as mentioned above, more preferably at least 0.1, and still more preferably at least 0.2.

In another preferred embodiment of the present invention, there is provided an arrangement in which at least two layers selected from the above-mentioned first to third hard coating films are formed in a laminated structure in addition of a single-layer structure comprising one of the first to third coating films.

In either of the single-layer and plural-layer structures, it is preferable that the total thickness of the hard coating film of the present invention should be within the range of at least 1 μm to 5 μm inclusive. If the hard coating film is formed to have a thickness of less than 1 μm, the film thickness is too small to provide adequate resistance to wear. On the other hand, if the film thickness exceeds 5 μm, there may occur a chipping or peeling-off of a part of the film during cutting operation.

In some applications of the hard coating film according to the present invention, a layer formed of TiN, TiAlN, TiCrAlN, TiCN, TiAlCN, TiCrAlCN, TiC, or the like may be laminated on one or both sides of the hard coating film to the extent that the characteristics of oxidation resistance and wear resistance of the hard coating film are not impaired.

In the present invention, there is also included a machine shop tool comprising a substrate and at least one of the above-mentioned first to third hard coating films formed on the surface thereof. Typical examples of the machine shop tools to which the present invention is applicable are as follows; cutting tools to be used for such purposes as metal cutting, drilling and end milling, metal dies to be used for such purposes as forging, press molding and extrusion molding, and jigs and tools to be used for such purposes as punching and blanking.

The kind of the above-mentioned substrate on which the hard coating film of this invention is to be formed should be determined according to the kind of the machine shop tool to be fabricated for each purpose of use. Various steel products such as carbon steels for machine structural use, alloy steels for structural use, tool steels and stainless steels, and various metallic products such as cemented carbide metals are applicable as substrates. Further, the substrate may comprise an undercoating layer such as a plating layer or sprayed coating layer formed on the surface thereof.

As a method for forming the hard coating film according to the present invention, it is recommended to employ a method of physical vapor deposition (PVD) using a target, though not limited thereto. In particular, a cathode-discharge arc ion plating method (AIP method), which is a kind of PVD, is preferable. If a sputtering method is employed for forming the hard coating film of the present invention, a considerable degree of discrepancy is prone to occur between the component element composition of each target and that of the hard coating film formed by using the target. In cases where the AIP method mentioned above is employed, there occurs substantially no problem of discrepancy between the component element compositions of the target and hard coating film. Further, since the ionization rates of target elements in the AIP method are relatively high, the AIP method is also advantageous in that a closer crystal packing is provided in the formation of a coating film to ensure higher hardness thereof.

Figure 1:
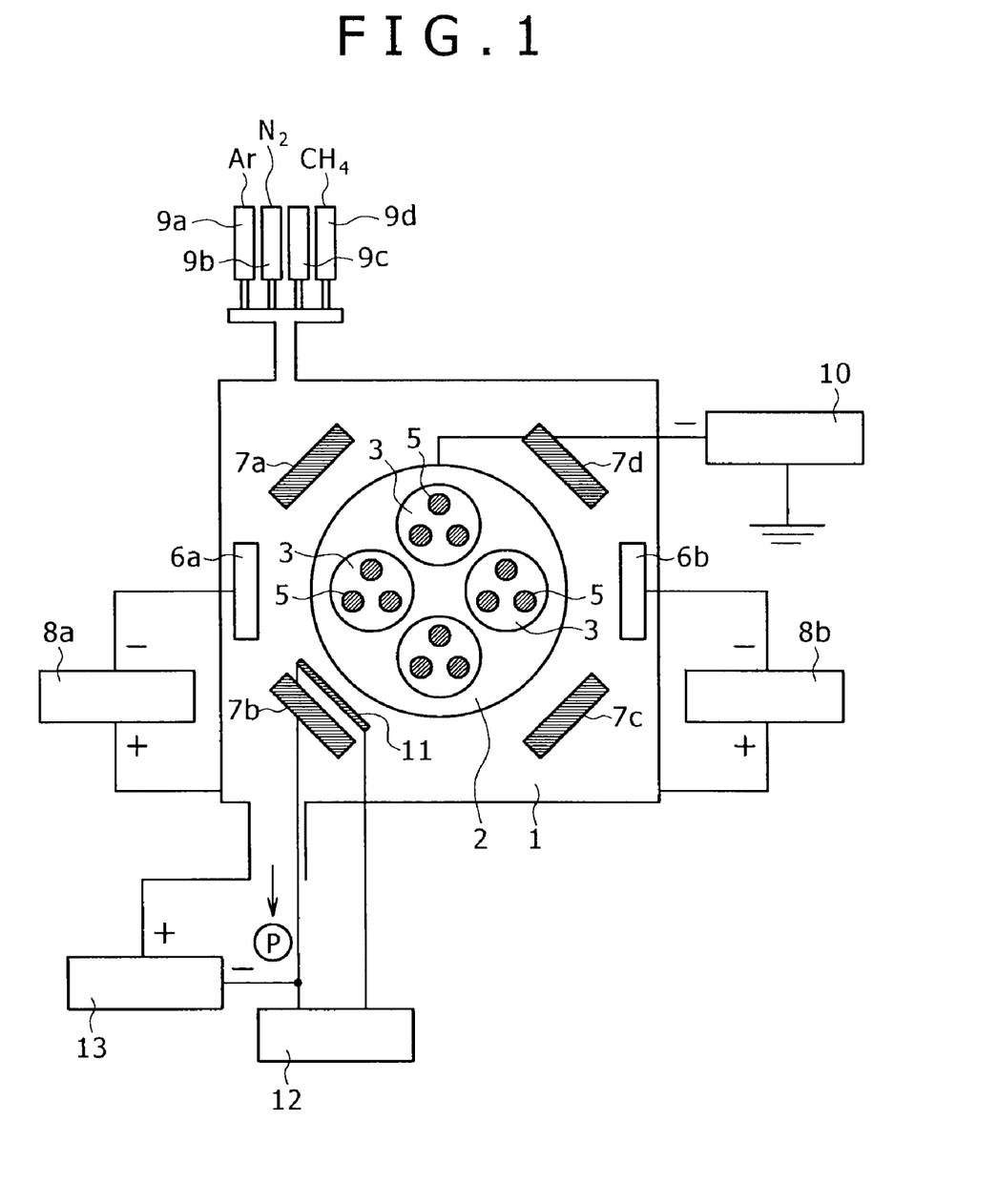
FIG. 1 is an explanatory schematic diagram showing a configuration example of a film forming apparatus for producing hard coating films according to a preferred embodiment of the present invention.

FIG. 1 is an explanatory schematic diagram showing a configuration example of an arc ion plating apparatus (AIP film forming apparatus) for producing hard coating films according to a preferred embodiment of the present invention. In the AIP film forming apparatus illustrated in FIG. 1, a vacuum chamber 1 thereof is provided with a rotating disc 2, on which four turntables 3 are disposed in a symmetrical fashion. On each of the turntables 3, an object under processing (substrate) 5 is mounted. Around the rotating disc 2, there are disposed a plurality of arc evaporation sources 6a and 6b (cathodes) (two arc evaporation sources in FIG. 1), and a plurality of heaters 7a, 7b, 7c and 7d. For the arc evaporation sources 6a and 6b, a plurality of arc power sources 8a and 8b are disposed respectively.

In FIG. 1, reference numeral 11 indicates a filament-type ion source, reference numeral 12 indicates a filament-heating AC power supply, and reference numeral 13 indicates a discharging DC power supply. A filament (made of tungsten) of the filament-type ion source 11 is heated by a current applied from the filament-heating AC power supply 12, and thermoelectrons emitted from the filament are induced to the vacuum chamber 1 by the discharging DC power supply 13 to form a plasma (Ar) between the filament and the vacuum chamber 1, thereby producing Ar ions. Using the Ar ions thus produced, the cleaning of the object under processing (substrate) is carried out. The inside of the vacuum chamber 1 is evacuated by a vacuum pump P, and through mass flow controllers 9a, 9b, 9c and 9d, various film forming gases are introduced into the inside of the vacuum chamber 1.

In combination with the filament-type ion source 11, a target having a particular component composition is used on each of the arc evaporation sources 6a and 6b. While the target is vaporized in an atmosphere of a film forming gas (O-source-containing gas, N-source-containing gas, dilute gas thereof with inert gas, or the like), the rotating disc 2 and the turntable 3 are turned to form a hard coating film on the surface of the object under processing (substrate) 5. In FIG. 1, reference numeral 10 indicates a bias power supply equipped for applying a negative (bias) voltage to the object under processing (substrate) 5.

For forming the hard coating film of the present invention, it is advantageous to employ the AIP method in which each target used as a solid evaporation material is ionized for hard coating film formation on a substrate (object under processing) as mentioned above. In a vapor deposition coating operation such as AIP, the component composition of each target to be used determines the component composition of the coating film to be formed. It is therefore preferable that the component composition of the target to be used should be identical to that of the coating film to be formed.

In a preferred embodiment of the present invention for forming the above-mentioned first hard coating film by the AIP method, there is provided a target comprising a component composition represented by the formula:

wherein $0 \leq a \leq 0.2$
$0.05 \leq b \leq 0.4$
$0.45 \leq c \leq 0.65$
$0.005 \leq d \leq 0.05$
$0 \leq e \leq 0.15$
$a+b+c+d+e=1$
where M denotes at least one species selected from the group consisting of Ce, Pr, and Sc; and variables a, b, c, d, and e indicate the atomic ratios of Ti, Cr, Al, M, and B respectively. It is preferable to use a target having the same component composition as that of the hard coating film to be formed.

In another preferred embodiment of the present invention for forming the above-mentioned second hard coating film by the AIP method, there is provided a target comprising a component composition represented by the formula:

wherein $0 \leq a \leq 0.2$
$0.05 \leq b \leq 0.4$
$0.45 \leq c \leq 0.65$
$0.005 \leq d \leq 0.05$
$0.01 \leq f \leq 0.1$
$0 \leq e \leq 0.15$
$a+b+c+d+e+f=1$
where M denotes at least one species selected from the group consisting of Ce, Pr, and Sc; R denotes at least one of Si and Y; and variables a, b, c, d, f, and e indicate the atomic ratios of Ti, Cr, Al, M, R, and B respectively. It is preferable to use a target having the same component composition as that of the hard coating film to be formed.

In another preferred embodiment of the present invention for forming the above-mentioned third hard coating film by the AIP method, there is provided a target comprising a component composition represented by the formula:

wherein $0.55 \leq a+b \leq 0.945$
$0.005 \leq d \leq 0.05$
$0.05 \leq f \leq 0.4$
$0 \leq e \leq 0.15$
$a+b+d+e+f=1$
where M' denotes at least one species selected from the group consisting of Ce, Pr, Sc, and Y; and variables a, b, d, f, and e indicate the atomic ratios of Ti, Cr, M', Si, and B respectively, either one of the variables a and b being allowable to equal zero. It is preferable to use a target having the same component composition as that of the hard coating film to be formed.

The rare earth elements (Ce, Pr, Sc, and Y) contained in the target are highly reactive with oxygen in particular. In cases where oxygen is also contained in the target, the oxygen is readily bonded to each of the rare earth elements to form an oxide. If the quantities of oxides thus formed are large, an abnormal arc discharge may occur at the time of hard coating film formation. To prevent such a problematic condition, the content of oxygen in the target of the present invention should be preferably no higher than 0.3%) by mass, more preferably no higher than 0.1% by mass.

Further, it is preferable that other impurities (e.g., hydrogen, chlorine, copper, and magnesium), which are capable of readily intruding into the target, should be excluded from the target to an extent as far as possible. Thus, unpredictable generation of gases of these impurities from the target hardly occurs at the time of hard coating film formation, thereby preventing unstable arc discharging. More specifically, it is preferable that the content of hydrogen in the target should be no higher than 0.05% by mass, the content of chlorine be no higher than 0.2% by mass, the content of copper be no higher than 0.05% by mass, and the content of magnesium be no higher than 0.03% by mass.

Although the present invention is not directed to specifying any particular methods for target fabrication, an example of a target fabrication method is as follows: Raw materials such as Al powder material, Cr powder material, Ti powder material, and powder materials of rare earth elements indicated in the present invention are adjusted properly with respect to such factors as quantitative ratio and grain size, and then these raw materials are mixed uniformly by using a V-type mixer or the like to produce a homogeneous powder mixture. Thereafter, the homogeneous powder mixture thus produced is subjected to cold isostatic pressing (CIP) processing or hot isostatic pressing (HIP) processing to form a target meeting each component composition specified in the present invention.

In cases where the HIP processing is adopted for target molding, it is preferable to set up a processing temperature in the range of 400 to 500° C. under 1000 atmospheric pressure. Besides the HIP or CIP processing, a hot extrusion method, very-high-pressure hot pressing method, or the like may be adopted for the fabrication of a target meeting each component composition specified in the present invention.

The present invention will be described in more detail with reference to the following examples; however, it is to be understood that the present invention is not limited by any of the details of the following examples and that various changes and modifications may be made in the present invention without departing from the spirit and scope thereof.

EXAMPLES

Example 1

Coating films having the component compositions shown in TABLE 1 were formed on substrates by using the film forming apparatus shown in FIG. 1, and evaluations of oxidation resistance and wear resistance were made on the coating films thus formed.

Mirror-finished substrates made of cemented carbide (JIS-P class), platinum substrates for oxidation resistance evaluation, and two-flute end mills (ø10 mm, made of cemented carbide) for cutting test were used for film formation thereon in the film forming apparatus. After the vacuum chamber of the film forming apparatus was evacuated below $1 \times 10^{-3}$ Pa, each substrate was heated until the temperature thereof reached 550° C. Then, sputter cleaning with Ar ions was carried out. Thereafter, a nitrogen gas was introduced into the vacuum chamber until a pressure level of 4 Pa was reached. Under this condition, arc discharging was performed at a current of 150 A by using each target indicated below. Thus, a coating film (approximately 3 µm in thickness) having a component composition shown in TABLE 1 was formed on a substrate. In the formation of a coating film containing carbon (Nos. 32 to 34 in TABLE 1), a methane gas was also introduced into the vacuum chamber at a pressure level ranging from 0.1 to 0.5 Pa. A bias voltage of −100 V with respect to ground potential was applied at the time of film formation.

A target having a component composition corresponding to that of each coating film to be formed was used: In accordance with TABLE 1, a target containing (Ti, Al) was used for No. 1, a target containing (Ti, Cr, Al) was used for No. 2, a target containing (Ti, Cr, Al, M) was used for Nos. 3 to 16, 18 to 23, 25 to 29, and 32 to 34, a target containing (Ti, Al, M) was used for No. 17, a target containing (Cr, Al, M) was used for No. 24, a target containing (Ti, Cr, Al, M, B) was used for Nos. 30 and 31, a target containing (Ti, Cr, Al, La) was used for No. 35, and a target containing (Ti, Cr, Al, Gd) was used for No. 36. The atomic ratios of respective components in each target were consistent with those in each coating film to be formed. For target fabrication, powder metallurgy was adopted; more specifically, in the HIP processing, solidification and densification were carried out at a sintering temperature of 500° C. under 1000 atmospheric pressure.

On each prepared sample having a coating film formed on a cemented carbide substrate, Vickers hardness tests were conducted under measurement conditions of 0.25 N in load and 15 seconds in load-holding time at room temperature. The component composition of a coating film of each sample was determined by EDX analysis. (As regards the component compositions of the coating films of samples in the following Examples 2 and 3, EDX analysis was also carried out for confirmation as in the present Example 1.) Further, on each prepared sample having a coating film formed on a platinum substrate and each prepared sample having a coating film formed on a two-flute end mill (ø10 mm, made of cemented carbide), evaluations of oxidation resistance and wear resistance were made as described below. The results of these examinations are shown in TABLE 1.

Oxidation Resistance Evaluations:

A sample having a coating film formed on a platinum substrate was heated in dry air (at a temperature rising rate of 4° C./minute), and an oxidation mass gain thereon was measured to determine an oxidation starting temperature of each coating film.

Cutting Tests:

With a sample having a coating film formed on a two-flute end mill (ø10 mm, made of cemented carbide), cutting tests were conducted under the conditions shown below, and the amount of wear of each sample was measured for evaluation of wear resistance.

[Cutting Test Conditions]
Work material: SKD11 (HRC60)
Cutting speed: 150 m/minute
Feed per tooth: 0.04 mm/tooth
Axial depth of cut: 4.5 mm
Radial depth of cut: 0.2 mm
Length of cut: 100 m
Others: Down cutting, dry cutting, air blowing only

TABLE 1

| No. | Ti | Cr | Al | M | (Atomic ratio) | B | C | N | (Atomic ratio) | Hardness (GPa) | Oxidation starting temperature (° C.) | Amount of wear (µm) |
|---|---|---|---|---|---|---|---|---|---|---|---|---|
| 1 | 0.5 | 0 | 0.5 | — | | 0 | 0 | 0 | 1 | 25 | 800 | 150 |
| 2 | 0.2 | 0.2 | 0.6 | — | | 0 | 0 | 0 | 1 | 28 | 900 | 125 |
| 3 | 0.2 | 0.2 | 0.595 | Sc | 0.005 | 0 | 0 | 1 | | 30 | 1050 | 70 |
| 4 | 0.2 | 0.2 | 0.59 | Sc | 0.01 | 0 | 0 | 1 | | 33 | 1150 | 45 |
| 5 | 0.2 | 0.2 | 0.585 | Sc | 0.015 | 0 | 0 | 1 | | 35 | 1250 | 25 |

TABLE 1-continued

| No. | Ti | Cr | Al | M (Atomic ratio) | | B | C (Atomic ratio) | N | Hardness (GPa) | Oxidation starting temperature (°C.) | Amount of wear (μm) |
|---|---|---|---|---|---|---|---|---|---|---|---|
| 6 | 0.2 | 0.2 | 0.57 | Sc | 0.03 | 0 | 0 | 1 | 32 | 1200 | 45 |
| 7 | 0.2 | 0.2 | 0.55 | Sc | 0.05 | 0 | 0 | 1 | 30 | 1100 | 65 |
| 8 | 0.2 | 0.2 | 0.5 | Sc | 0.1 | 0 | 0 | 1 | 25 | 900 | 115 |
| 9 | 0.2 | 0.2 | 0.585 | Pr | 0.015 | 0 | 0 | 1 | 34 | 1100 | 39 |
| 10 | 0.2 | 0.2 | 0.585 | Ce | 0.015 | 0 | 0 | 1 | 33 | 1150 | 43 |
| 11 | 0.1 | 0.17 | 0.7 | Sc | 0.03 | 0 | 0 | 1 | 22 | 1100 | 120 |
| 12 | 0.1 | 0.22 | 0.65 | Sc | 0.03 | 0 | 0 | 1 | 31 | 1250 | 53 |
| 13 | 0.2 | 0.17 | 0.6 | Sc | 0.03 | 0 | 0 | 1 | 36 | 1250 | 22 |
| 14 | 0.2 | 0.22 | 0.55 | Sc | 0.03 | 0 | 0 | 1 | 35 | 1200 | 27 |
| 15 | 0.2 | 0.32 | 0.45 | Sc | 0.03 | 0 | 0 | 1 | 32 | 1150 | 55 |
| 16 | 0.2 | 0.47 | 0.3 | Sc | 0.03 | 0 | 0 | 1 | 21 | 800 | 170 |
| 17 | 0.42 | 0 | 0.55 | Ce | 0.03 | 0 | 0 | 1 | 28 | 800 | 160 |
| 18 | 0.2 | 0.05 | 0.72 | Ce | 0.03 | 0 | 0 | 1 | 32 | 1070 | 120 |
| 19 | 0.2 | 0.12 | 0.65 | Ce | 0.03 | 0 | 0 | 1 | 33 | 1100 | 65 |
| 20 | 0.2 | 0.22 | 0.55 | Ce | 0.03 | 0 | 0 | 1 | 35 | 1160 | 34 |
| 21 | 0.12 | 0.3 | 0.55 | Ce | 0.03 | 0 | 0 | 1 | 34 | 1230 | 25 |
| 22 | 0.07 | 0.4 | 0.5 | Ce | 0.03 | 0 | 0 | 1 | 31 | 1200 | 40 |
| 23 | 0.02 | 0.5 | 0.45 | Ce | 0.03 | 0 | 0 | 1 | 27 | 1150 | 120 |
| 24 | 0 | 0.4 | 0.57 | Pr | 0.03 | 0 | 0 | 1 | 28 | 1200 | 65 |
| 25 | 0.05 | 0.35 | 0.57 | Pr | 0.03 | 0 | 0 | 1 | 35 | 1250 | 35 |
| 26 | 0.1 | 0.3 | 0.57 | Pr | 0.03 | 0 | 0 | 1 | 37 | 1250 | 31 |
| 27 | 0.15 | 0.25 | 0.57 | Pr | 0.03 | 0 | 0 | 1 | 37 | 1300 | 30 |
| 28 | 0.2 | 0.2 | 0.57 | Pr | 0.03 | 0 | 0 | 1 | 35 | 1200 | 55 |
| 29 | 0.3 | 0.2 | 0.47 | Pr | 0.03 | 0 | 0 | 1 | 29 | 1000 | 100 |
| 30 | 0.2 | 0.18 | 0.5 | Sc | 0.02 | 0.1 | 0 | 1 | 36 | 1200 | 37 |
| 31 | 0.15 | 0.18 | 0.45 | Sc | 0.02 | 0.2 | 0 | 1 | 29 | 1000 | 100 |
| 32 | 0.2 | 0.23 | 0.55 | Sc | 0.02 | 0 | 0.2 | 0.8 | 35 | 1100 | 45 |
| 33 | 0.2 | 0.23 | 0.55 | Sc | 0.02 | 0 | 0.4 | 0.6 | 34 | 1000 | 65 |
| 34 | 0.2 | 0.23 | 0.55 | Sc | 0.02 | 0 | 0.6 | 0.4 | 28 | 800 | 120 |
| 35 | 0.2 | 0.22 | 0.55 | La* | 0.03 | 0 | 0 | 1 | 27 | 1050 | 70 |
| 36 | 0.2 | 0.22 | 0.55 | Gd* | 0.03 | 0 | 0 | 1 | 25 | 1100 | 65 |

*Rare earth elements, though not included in the species of M.

With reference to TABLE 1, the following conclusion can be drawn on the basis of the examinations mentioned above: The hard coating films meeting the component compositions defined by the present invention are superior in both oxidation resistance and wear resistance. In contrast, the coating films not meeting the component compositions defined by the present invention, and the coating films containing other elements (La, Gd) than those specified by the present invention are inferior in wear resistance or in both oxidation resistance and wear resistance.

Example 2

In this example, for evaluating the characteristics of the second hard coating film of the present invention, at least one of Si and Y was added to an augend component composition such as $(Ti_{0.2}Cr_{0.23}Al_{0.55}Sc_{0.02})N$, which corresponds to one of the component compositions of the first hard coating film. On each prepared sample, the effect by the addition of at least one of Si and Si was examined.

More specifically, coating films having the component compositions shown in TABLE 2 were formed in the same manner as in Example 1. Then, Vickers hardness tests, and evaluations of oxidation resistance and wear resistance were conducted as in Example 1. The results of these examinations are shown in TABLE 2.

TABLE 2

| No. | Ti | Cr | Al | M | | R (Atomic ratio) | B | C (Atomic ratio) | N | Hardness (Gpa) | Oxidation starting temperature (°C.) | Amount of wear (μm) |
|---|---|---|---|---|---|---|---|---|---|---|---|---|
| 1 | 0.2 | 0.23 | 0.55 | Sc | 0.02 | — | 0 | 0 | 1 | 34 | 1200 | 35 |
| 2 | 0.2 | 0.22 | 0.55 | Sc | 0.02 | Si | 0.01 | 0 | 1 | 35 | 1250 | 30 |
| 3 | 0.19 | 0.22 | 0.55 | Sc | 0.02 | Si | 0.02 | 0 | 1 | 36 | 1300 | 27 |
| 4 | 0.2 | 0.18 | 0.55 | Sc | 0.02 | Si | 0.05 | 0 | 1 | 38 | 1300 | 25 |
| 5 | 0.13 | 0.2 | 0.55 | Sc | 0.02 | Si | 0.1 | 0 | 1 | 37 | 1300 | 30 |
| 6 | 0.1 | 0.13 | 0.55 | Sc | 0.02 | Si | 0.2 | 0 | 1 | 28 | 1200 | 97 |
| 7 | 0.2 | 0.22 | 0.55 | Sc | 0.02 | Y | 0.01 | 0 | 1 | 36 | 1300 | 31 |
| 8 | 0.2 | 0.21 | 0.55 | Sc | 0.02 | Y | 0.02 | 0 | 1 | 38 | 1350 | 34 |
| 9 | 0.2 | 0.18 | 0.55 | Sc | 0.02 | Y | 0.05 | 0 | 1 | 38 | 1350 | 22 |
| 10 | 0.13 | 0.2 | 0.55 | Sc | 0.02 | Y | 0.1 | 0 | 1 | 34 | 1350 | 35 |
| 11 | 0.1 | 0.13 | 0.55 | Sc | 0.02 | Y | 0.2 | 0 | 1 | 27 | 1100 | 110 |
| 12 | 0.19 | 0.05 | 0.65 | Sc | 0.03 | Si, Y | 0.08 | 0 | 1 | 37 | 1250 | 30 |
| 13 | 0.19 | 0.05 | 0.6 | Sc | 0.08 | Si, Y | 0.08 | 0 | 1 | 28 | 1200 | 88 |
| 14 | 0.15 | 0.25 | 0.55 | Sc | 0.02 | Si | 0.03 | 0 | 1 | 37 | 1300 | 22 |
| 15 | 0.15 | 0.25 | 0.55 | Ce | 0.02 | Y | 0.03 | 0 | 1 | 36 | 1350 | 27 |
| 16 | 0.2 | 0.18 | 0.5 | Sc | 0.02 | Si | 0.05 | 0.05 | 0 | 1 | 37 | 1250 | 30 |

TABLE 2-continued

| No. | Ti | Cr | Al | M | | R | | B | C | N | Hardness (Gpa) | Oxidation starting temperature (° C.) | Amount of wear (μm) |
|---|---|---|---|---|---|---|---|---|---|---|---|---|---|
| | | | (Atomic ratio) | | | | | (Atomic ratio) | | | | | |
| 17 | 0.2 | 0.18 | 0.55 | Sc | 0.02 | Si | | 0.05 | 0 | 0.1 | 0.9 | 38 | 1200 | 35 |
| 18 | 0.19 | 0.22 | 0.55 | Pr | 0.02 | Si | | 0.02 | 0 | 0 | 1 | 35 | 1250 | 25 |
| 19 | 0.2 | 0.21 | 0.55 | Pr | 0.02 | Si, Y | | 0.02 | 0 | 0 | 1 | 37 | 1300 | 33 |

With reference to TABLE 2, the following conclusion can be drawn on the basis of the examinations mentioned above: Oxidation resistance and wear resistance can be enhanced by adding at least one of Si and Y, within the compositional range specified by the present invention, to each augend component composition defined for the first hard coating film.

Example 3

In this example, for evaluating the characteristics of the third hard coating film of the present invention, coating films having the component compositions shown in TABLE 3 were formed in the same manner as in Example 1. Then, Vickers hardness tests, and evaluations of oxidation resistance and wear resistance were conducted as in Example 1. The results of these examinations are shown in TABLE 3.

TABLE 3

| No. | Ti | Cr | M | | Si | B | C | N | Hardness (GPa) | Oxidation starting temperature (° C.) | Amount of wear (μm) |
|---|---|---|---|---|---|---|---|---|---|---|---|
| | | (Atomic ratio) | | | | | (Atomic ratio) | | | | |
| 1 | 0.5 | 0.47 | Sc | 0.03 | 0 | 0 | 0 | 1 | 25 | 950 | 135 |
| 2 | 0.45 | 0.47 | Sc | 0.03 | 0.05 | 0 | 0 | 1 | 31 | 1100 | 60 |
| 3 | 0.5 | 0.37 | Sc | 0.03 | 0.1 | 0 | 0 | 1 | 32 | 1150 | 45 |
| 4 | 0.4 | 0.37 | Sc | 0.03 | 0.2 | 0 | 0 | 1 | 34 | 1200 | 30 |
| 5 | 0.3 | 0.37 | Sc | 0.03 | 0.3 | 0 | 0 | 1 | 33 | 1200 | 40 |
| 6 | 0.3 | 0.27 | Sc | 0.03 | 0.4 | 0 | 0 | 1 | 32 | 1300 | 55 |
| 7 | 0.25 | 0.22 | Sc | 0.03 | 0.5 | 0 | 0 | 1 | 26 | 1100 | 100 |
| 8 | 0.4 | 0.45 | — | 0 | 0.15 | 0 | 0 | 1 | 27 | 1000 | 110 |
| 9 | 0.445 | 0.4 | Y | 0.005 | 0.15 | 0 | 0 | 1 | 33 | 1200 | 55 |
| 10 | 0.44 | 0.4 | Y | 0.01 | 0.15 | 0 | 0 | 1 | 35 | 1300 | 37 |
| 11 | 0.42 | 0.4 | Y | 0.03 | 0.15 | 0 | 0 | 1 | 33 | 1350 | 25 |
| 12 | 0.4 | 0.4 | Y | 0.05 | 0.15 | 0 | 0 | 1 | 32 | 1250 | 65 |
| 13 | 0.35 | 0.4 | Y | 0.1 | 0.15 | 0 | 0 | 1 | 26 | 1200 | 120 |
| 14 | 0.8 | 0 | Ce | 0.05 | 0.15 | 0 | 0 | 1 | 37 | 1150 | 27 |
| 15 | 0 | 0.8 | Ce | 0.05 | 0.15 | 0 | 0 | 1 | 32 | 1350 | 35 |
| 16 | 0.42 | 0.37 | Y | 0.01 | 0.15 | 0.05 | 0 | 1 | 36 | 1300 | 37 |
| 17 | 0.44 | 0.4 | Y | 0.01 | 0.15 | 0 | 0.1 | 0.9 | 35 | 1250 | 40 |
| 18 | 0.77 | 0 | Y | 0.03 | 0.2 | 0 | 0 | 1 | 32 | 1050 | 70 |
| 19 | 0.67 | 0.05 | Y | 0.03 | 0.25 | 0 | 0 | 1 | 36 | 1300 | 30 |
| 20 | 0.62 | 0.1 | Y | 0.03 | 0.25 | 0 | 0 | 1 | 36 | 1350 | 25 |
| 21 | 0.52 | 0.2 | Y | 0.03 | 0.25 | 0 | 0 | 1 | 36 | 1350 | 20 |
| 22 | 0.42 | 0.3 | Y | 0.03 | 0.25 | 0 | 0 | 1 | 36 | 1400 | 21 |
| 23 | 0.8 | 0 | Pr | 0.05 | 0.15 | 0 | 0 | 1 | 33 | 1100 | 29 |
| 24 | 0 | 0.8 | Pr | 0.05 | 0.15 | 0 | 0 | 1 | 31 | 1300 | 37 |

With reference to TABLE 3, the following conclusion can be drawn on the basis of the examinations mentioned above: The hard coating films meeting the component compositions defined by the present invention (as defined for the third hard coating film of the present invention) are superior in both oxidation resistance and wear resistance. In contrast, the coating films not meeting the component compositions defined by the present invention are inferior in wear resistance or in both oxidation resistance and wear resistance. In the case that only Y was added as an additive species represented by M' with no addition of Cr (No. 18), the oxidation resistance and hardness of the coating film thus formed were relatively low as compared with the case that Cr was added. Resultantly, the wear resistance thereof was relatively low. Hence it follows that, if only Y is used as an additive species represented by M', the addition of Cr in combination with Y is preferable.

Example 4

In this example, the characteristics of targets were evaluated as described below. In the fabrication of each target, Al powder material, Cr powder material, Ti powder material, and M powder material were mixed in an inert gas (Ar) atmosphere by using a V-type mixer according to each component composition shown in TABLE 4. The average grain sizes of the Cr, Ti, Al and M powder materials used were no larger than #100-mesh respectively. The content of oxygen in each target to be formed depends on the content of oxygen in raw powder materials to be used. Accordingly, targets having different oxygen contents were formed by using raw powder materials having different oxygen contents.

The powder mixture produced in the manner mentioned above was subjected to HIP processing for solidification and densification at a sintering temperature of 500° C. under 1000 atmospheric pressure. Each target thus prepared was set on the film forming apparatus shown in FIG. 1, sputter cleaning was carried out, and then arc discharging was performed to check for stability thereof. The conditions of arc discharging were as follows.

Substrate temperature: 500° C.

Pure nitrogen: 4 Pa

Current per ø100 mm discharge area (target area): 150 A

The results of these examinations are shown in TABLE 4.

TABLE 4

| No. | Ti | Cr | Al | M | | Oxygen content in target (mass %) | Arc discharging state |
|---|---|---|---|---|---|---|---|
| | (Atomic ratio) | | | | | | |
| 1 | 0.15 | 0.3 | 0.545 | Sc | 0.005 | 0.01 | Stable |
| 2 | 0.15 | 0.3 | 0.545 | Sc | 0.005 | 0.05 | Stable |
| 3 | 0.15 | 0.3 | 0.545 | Sc | 0.005 | 0.1 | Stable |
| 4 | 0.15 | 0.3 | 0.545 | Sc | 0.005 | 0.3 | Deviated to some extent |
| 5 | 0.15 | 0.3 | 0.545 | Sc | 0.005 | 0.5 | Concentrated discharge |
| 6 | 0.15 | 0.3 | 0.545 | Sc | 0.005 | 1 | Concentrated discharge |
| 7 | 0.15 | 0.3 | 0.545 | Pr | 0.005 | 0.1 | Stable |
| 8 | 0.15 | 0.3 | 0.545 | Ce | 0.005 | 0.1 | Stable |

With reference to TABLE 4, the following conclusion can be drawn on the basis of the examinations mentioned above: To carry out film formation in a stable arc discharge state, it is preferable that the content of oxygen in a target should be within the range specified by the present invention.

The invention may be embodied in other specific forms without departing from the spirit or essential characteristics thereof. The present embodiments and examples are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A hard coating film formed on the surface of a substrate, said hard coating film comprising a component composition represented by the formula:

$$(Ti_a Cr_b Al_c M_d B_e)(C_x N_{1-x})$$

wherein $0 \leq a \leq 0.2$
$0.25 < b \leq 0.4$
$0.45 \leq c \leq 0.65$
$0.005 \leq d \leq 0.05$
$0 \leq e \leq 0.15$
$a+b+c+d+e=1$
$0 \leq x \leq 0.5$ where M denotes at least one species selected from the group consisting of Ce, Pr, and Sc; variables a, b, c, d, and e indicate the atomic ratios of Ti, Cr, Al, M, and B respectively; and variable x indicates the atomic ratio of C.

2. A hard coating film formed on the surface of a substrate, said hard coating film comprising a component composition represented by the formula:

$$(Ti_a Cr_b Al_c M_d R_f B_e)(C_x N_{1-x})$$

wherein $0 \leq a \leq 0.2$
$0.25 < b \leq 0.4$
$0.45 \leq c \leq 0.65$
$0.005 \leq d \leq 0.05$
$0.01 \leq f \leq 0.1$
$0 \leq e \leq 0.15$
$a+b+c+d+e+f=1$
$0 \leq x \leq 0.5$ where M denotes at least one species selected from the group consisting of Ce, Pr, and Sc; R denotes at least one of Si and Y; variables a, b, c, d, f, and e indicate the atomic ratios of Ti, Cr, Al, M, R, and B respectively; and variable x indicates the atomic ratio of C.

3. A hard coating film formed on the surface of a substrate, said hard coating film comprising a component composition represented by the formula:

$$(Ti_a Cr_b M'_d Si_f B_e)(C_x N_{1-x})$$

wherein $0.55 \leq a+b \leq 0.945$
$0.005 \leq d \leq 0.05$
$0.05 \leq f \leq 0.4$
$0 \leq e \leq 0.15$
$a+b+d+e+f=1$
$0 \leq x \leq 0.5$ where M' denotes at least one species selected from the group consisting of Ce, Pr, Sc, and Y; variables a, b, d, f, and e indicate the atomic ratios of Ti, Cr, M', Si, and B respectively, either one of said variables a and b being allowable to equal zero; and variable x indicates the atomic ratio of C.

4. A hard coating film as claimed in claim 3, wherein M' in said formula denotes Y, and also said variable b in said formula is no less than 0.05.

5. A machine shop tool comprising a substrate and a hard coating film formed on the surface of said substrate, said hard coating film having a component composition defined in claim 1.

6. A machine shop tool comprising a substrate and a hard coating film formed on the surface of said substrate, said hard coating film having a component composition defined in claim 2.

7. A machine shop tool comprising a substrate and a hard coating film formed on the surface of said substrate, said hard coating film having a component composition defined in claim 3.

8. A machine shop tool comprising a substrate and a hard coating film formed on the surface of said substrate, said hard coating film having a component composition defined in claim 4.

9. A target for forming a hard coating film on the surface of a substrate by arc ion plating, said hard coating film having a component composition defined in claim 1, said target comprising a component composition represented by the formula:

$$Ti_a Cr_b Al_c M_d B_e$$

wherein $0 \leq a \leq 0.2$
$0.25 < b \leq 0.4$
$0.45 \leq c \leq 0.65$
$0.005 \leq d \leq 0.05$
$0 \leq e \leq 0.15$
$a+b+c+d+e=1$ where M denotes at least one species selected from the group consisting of Ce, Pr, and Sc; and variables a, b, c, d, and e indicate the atomic ratios of Ti, Cr, Al, M, and B respectively.

10. A target for forming a hard coating film on the surface of a substrate by arc ion plating, said hard coating film having a component composition defined in claim 2, said target comprising a component composition represented by the formula:

$$Ti_a Cr_b Al_c M_d R_f B_e$$

wherein $0 \leq a \leq 0.2$
$0.25 < b \leq 0.4$
$0.45 \leq c \leq 0.65$
$0.005 \leq d \leq 0.05$
$0.01 \leq f \leq 0.1$
$0 \leq e \leq 0.15$
$a+b+c+d+e+f=1$ where M denotes at least one species selected from the group consisting of Ce, Pr, and Sc; R denotes at least one of Si and Y; and variables a, b, c, d, f, and e indicate the atomic ratios of Ti, Cr, Al, M, R, and B respectively.

11. A target for forming a hard coating film on the surface of a substrate by arc ion plating, said hard coating film having a component composition defined in claim 3, said target comprising a component composition represented by the formula:

wherein $0.55 \leq a+b \leq 0.945$
$0.005 \leq d \leq 0.05$
$0.05 \leq f \leq 0.4$
$0 \leq e \leq 0.15$
$a+b+d+e+f=1$ where M' denotes at least one species selected from the group consisting of Ce, Pr, Sc, and Y; and variables a, b, d, f, and e indicate the atomic ratios of Ti, Cr, M', Si, and B respectively, either one of said variables a and b being allowable to equal zero.

12. A target as claimed in claim 9, wherein the content of oxygen in said target is no higher than 0.3% by mass.

13. A target as claimed in claim 10, wherein the content of oxygen in said target is no higher than 0.3% by mass.

14. A target as claimed in claim 11, wherein the content of oxygen in said target is no higher than 0.3% by mass.

15. The hard coating film according to claim 1, wherein M denotes at least one species selected from the group consisting of Ce and Pr.

16. The hard coating film according to claim 2, wherein M denotes at least one species selected from the group consisting of Ce and Pr.

17. The hard coating film according to claim 3, wherein M denotes at least one species selected from the group consisting of Ce and Pr.

18. The hard coating film according to claim 1, wherein the film has an amount of wear of from 25 to 65 μm.

19. The hard coating film according to claim 2, wherein the film has an amount of wear of from 25 to 65 μm.

20. The hard coating film according to claim 1, wherein the film has an hardness of from 28 to 37 GPa.

21. The hard coating film according to claim 2, wherein the film has an hardness of from 28 to 37 GPa.

* * * * *